(12) United States Patent
Kang (10) Patent No.: US 9,472,290 B2
(45) Date of Patent: Oct. 18, 2016

(54) SEMICONDUCTOR DEVICE AND METHOD OF ERASING THE SAME

(71) Applicant: SK hynix Inc., Gyeonggi-do (KR)

(72) Inventor: Tai Kyu Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/702,413

(22) Filed: May 1, 2015

(65) Prior Publication Data

US 2016/0172043 A1    Jun. 16, 2016

(30) Foreign Application Priority Data

Dec. 15, 2014  (KR) ........................ 10-2014-0180695

(51) Int. Cl.
| | |
|---|---|
| *G11C 16/04* | (2006.01) |
| *G11C 16/14* | (2006.01) |
| *G11C 16/08* | (2006.01) |
| *G11C 16/34* | (2006.01) |
| *G11C 16/16* | (2006.01) |

(52) U.S. Cl.
CPC ........... *G11C 16/14* (2013.01); *G11C 16/0483* (2013.01); *G11C 16/08* (2013.01); *G11C 16/16* (2013.01); *G11C 16/3445* (2013.01); *G11C 16/3459* (2013.01)

(58) Field of Classification Search
CPC .............. G11C 16/0483; G11C 16/14; G11C 16/3445; G11C 16/3472; G11C 5/02
USPC .............. 365/185.17, 185.22, 185.29, 185.3, 365/185.33
See application file for complete search history.

(56) References Cited

U.S. PATENT DOCUMENTS

| | | | |
|---|---|---|---|
| 8,085,593 B2* | 12/2011 | Park ....................... | G11C 16/08 365/185.11 |
| 8,103,841 B2* | 1/2012 | Sinclair ............... | G06F 11/1072 711/103 |
| 8,787,094 B2* | 7/2014 | Costa ....................... | G11C 5/02 365/185.17 |
| 2015/0170748 A1* | 6/2015 | Costa ....................... | G11C 5/02 365/185.17 |

FOREIGN PATENT DOCUMENTS

| | | |
|---|---|---|
| KR | 1020110078739 | 7/2011 |
| KR | 1020110078740 | 7/2011 |

* cited by examiner

*Primary Examiner* — Gene Auduong
(74) *Attorney, Agent, or Firm* — IP & T Group LLP (57) ABSTRACT

A semiconductor device and a method of operating the same are provided. The method includes performing a multi-plane erase operation on selected planes; determining that the multi-plane erase operation has failed when a number of erase loops reaches a maximum number without successful completion of the multi-plane erase operation; determining whether there are passed planes amongst the selected planes; and performing a soft program operation on the passed planes.

16 Claims, 7 Drawing Sheets

FIG. 8

SEMICONDUCTOR DEVICE AND METHOD OF ERASING THE SAME

CROSS-REFERENCE TO RELATED APPLICATION

The present application claims priority to Korean patent application number 10-2014-0180695, filed on Dec. 15, 2014, the entire disclosure of which is incorporated herein in its entirety by reference.

BACKGROUND

1. Field of Invention

The present invention relates to a semiconductor device and a method of operating the same. More specifically, the present invention relates to a semiconductor device performing a multi-plane erase operation.

2. Discussion of Related Art

A semiconductor memory device includes a memory cell array in which data is stored, a peripheral circuit configured to perform erase operations, program operations, and read operations on the memory cell array, and a control circuit for controlling the peripheral circuit. A plurality of planes are included in the memory cell array, and a plurality of memory blocks are included in each of the plurality of planes.

In order to reduce the operating time of the semiconductor device, a multi-plane erase operation may be performed. During a multi-plane erase operation, multiple planes may be erased simultaneously.

During a multi-plane erase operation, when an erase verifying operation fails on some of the planes, the normal planes for which the erase verifying operation was successful are also determined to have failed due to the failure of the erase verifying operation on some of the planes. The rest of the normal planes that were identified as having failed may not be used due to the failure of the erase verifying operation on some of the planes.

SUMMARY

Embodiments of the present invention is directed to a semiconductor device capable of determining only a plane, to which an erase verifying operation fails during a multi-plane erase operation, as a failed plane among selected planes subject to the multi-plane erase operation, and normally using the rest of the selected plane, and a method of operating the same.

One aspect of the present invention provides a method of operating a semiconductor device, including: performing a multi-plane erase operation on selected planes; determining that the multi-plane erase operation has failed when a number of erase loops reaches a maximum number without successful completion of the multi-plane erase operation; determining whether there are passed planes amongst the selected planes; and performing a soft program operation on the passed planes.

Another aspect of the present invention provides a semiconductor device, including: a plurality of planes suitable for storing data; a peripheral circuit suitable for performing a multi-plane erase operation and a soft program operation on the plurality of planes; and a control circuit suitable for determining whether there are one or more passed planes to which an erase verifying operation passes among selected planes of the plurality of planes when the multi-plane erase operation on the selected planes fails, and for controlling the peripheral circuit to perform the soft program operation on the passed planes.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Exemplary embodiments of the present invention will be described more fully hereinafter with reference to the accompanying drawings. The present invention may, however, be embodied in different forms and should not be construed as limited to the embodiments set forth herein. Exemplary embodiments of the present invention are described below in sufficient detail with reference to accompanying drawings to enable those of ordinary skill in the art to embody and practice the present invention.

Figure 1:
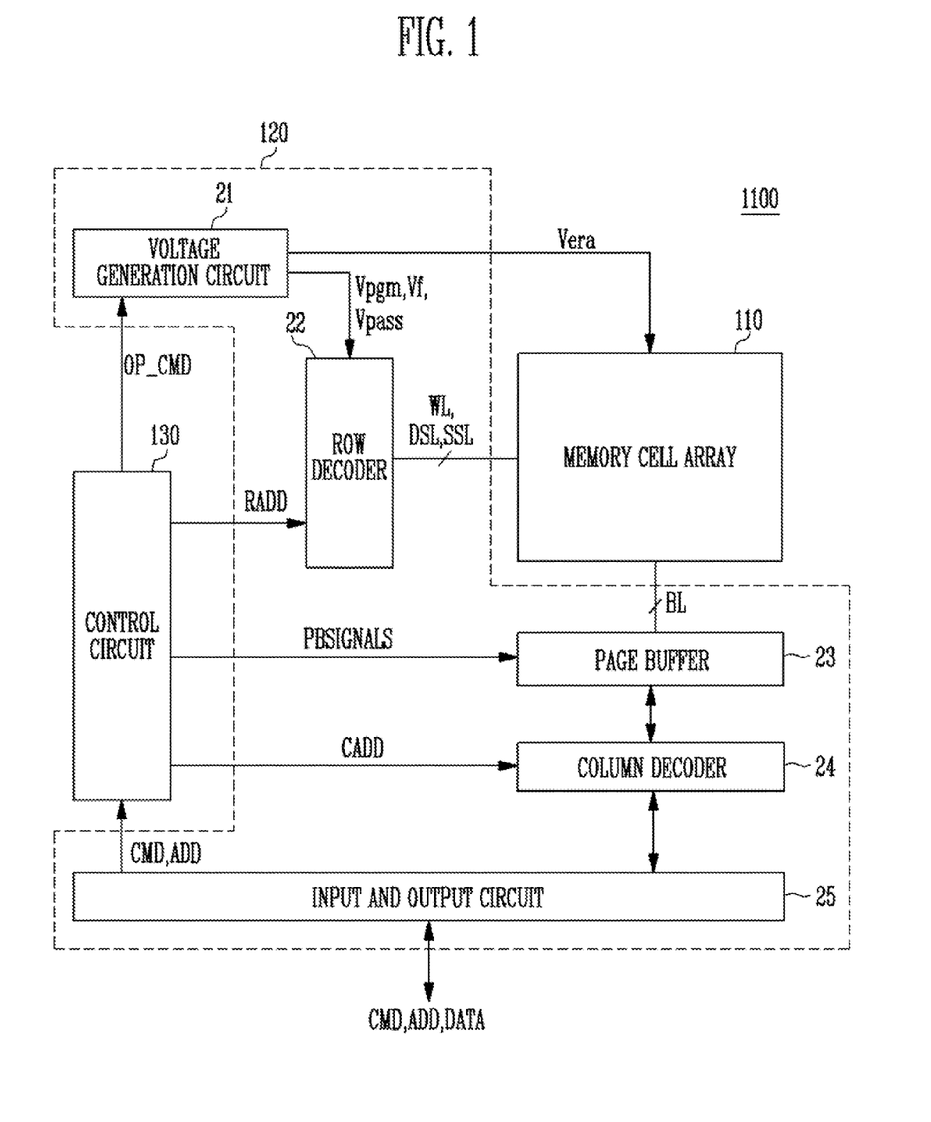
FIG. 1 is a diagram illustrating a semiconductor device according to an embodiment of the present invention.

FIG. 1 is a diagram illustrating a semiconductor device according to an embodiment of the present invention.

Referring to FIG. 1, a semiconductor device 1100 may include a memory cell array 110 in which data is stored, a peripheral circuit 120 performing a program operation, a read operation, and an erase operation to the memory cell array 110, and a control circuit 130 controlling the peripheral circuit 120.

The memory cell array 110 may include a plurality of planes, and a plurality of memory blocks are included in each plane.

The peripheral circuit 120 may include a voltage generation circuit 21, a row decoder 22, a page buffer 23, a column decoder 24, and an input and output circuit 25.

The voltage generation circuit 21 may generate operating voltages having various levels in response to an operating command signal OP_CMD. The operating command signal OP_CMD may include a program command signal, a read command signal, and an erase command signal. For example, the voltage generation circuit 21 may generate an erase voltage Vera, a soft program voltage Vpgm, a verifying voltage Vf, a pass voltage Vpass, and so forth. In a multi-plane erase operation, the erase voltage Vera may be applied to selected memory blocks among selected planes of the memory cell array 110.

The row decoder 22 may transfer the operating voltages to the selected memory blocks of the selected planes included in the memory cell array 110, in response to a row address RADD. For example, during the multi-plane erase operation, the row decoder 22 may transfer the soft program voltage Vpgm or the verifying voltage Vf to word lines WL of the selected memory blocks.

The page buffer 23 may be connected to the memory blocks included in the planes through bit lines BL, exchange data with the selected memory block in response to page buffer control signals PBSIGNALS during the program, read, and erase operations, and temporarily store the transferred data.

The column decoder 24 may exchange data with the page buffer 23 in response to a column address CADD.

The input and output circuit 25 may transfer a command signal CMD and an address ADD from the outside (e.g. from an external device, source, or host) to the control circuit 130, transfer data DATA from the outside to the column decoder 24, and transfer the data DATA from the column decoder 24 to the outside or the control circuit 130.

The control circuit 130 may control the peripheral circuit 120 to perform the program, erase, or read operations in response to the command signal CMD and the address ADD. For example, during the multi-plane erase operation, the control circuit 130 may determine whether there are one or more planes (hereinafter the "passed plane(s)"), to which the erase verifying operation passes among the selected planes subject to the multi-plane erase operation, when the selected planes subject to the multi-plane erase operation are determined to have failed due to a failure of the erase verifying operation on part of the selected plane. When there are planes that pass among the selected planes that were determined to have failed during the multi-plane erase operation, the control circuit 130 may control the peripheral circuit 120 to perform the multi-plane soft program operation on the passed planes.

Figure 2:
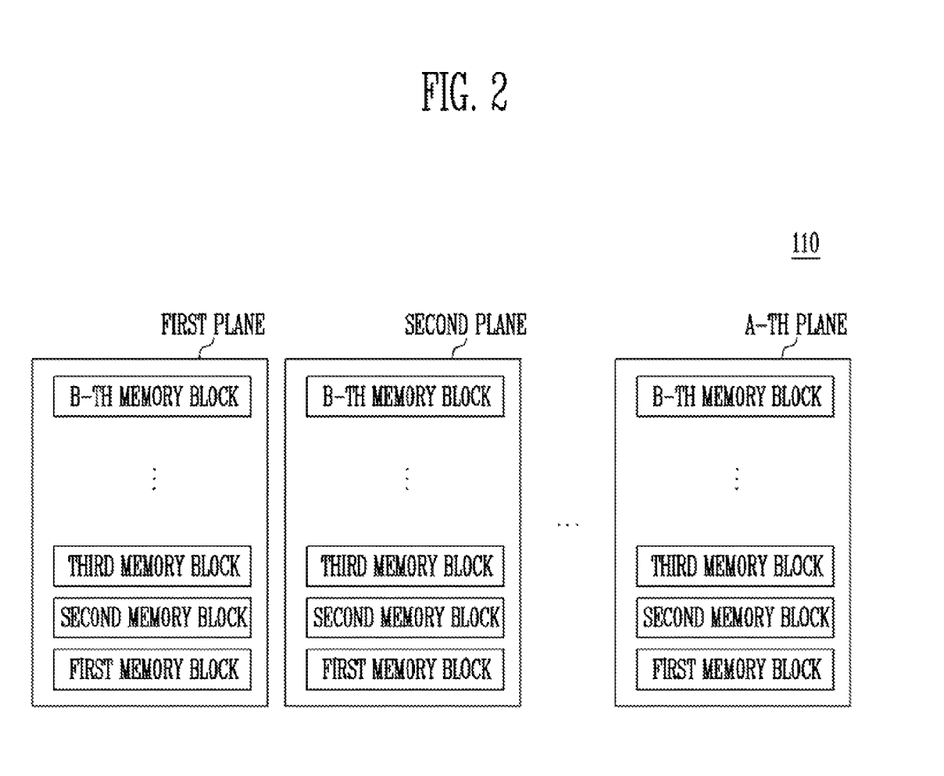
FIG. 2 is a diagram illustrating a memory cell array of FIG. 1.

FIG. 2 is a diagram illustrating a memory cell array of FIG. 1.

Referring to FIG. 2, the memory cell array 110 may include first to A-th planes (A is a positive integer), which have the same structure as one another. For example, the first plane may include first to B-th memory blocks (B is a positive integer), which have the same structure as one another.

Figure 3:
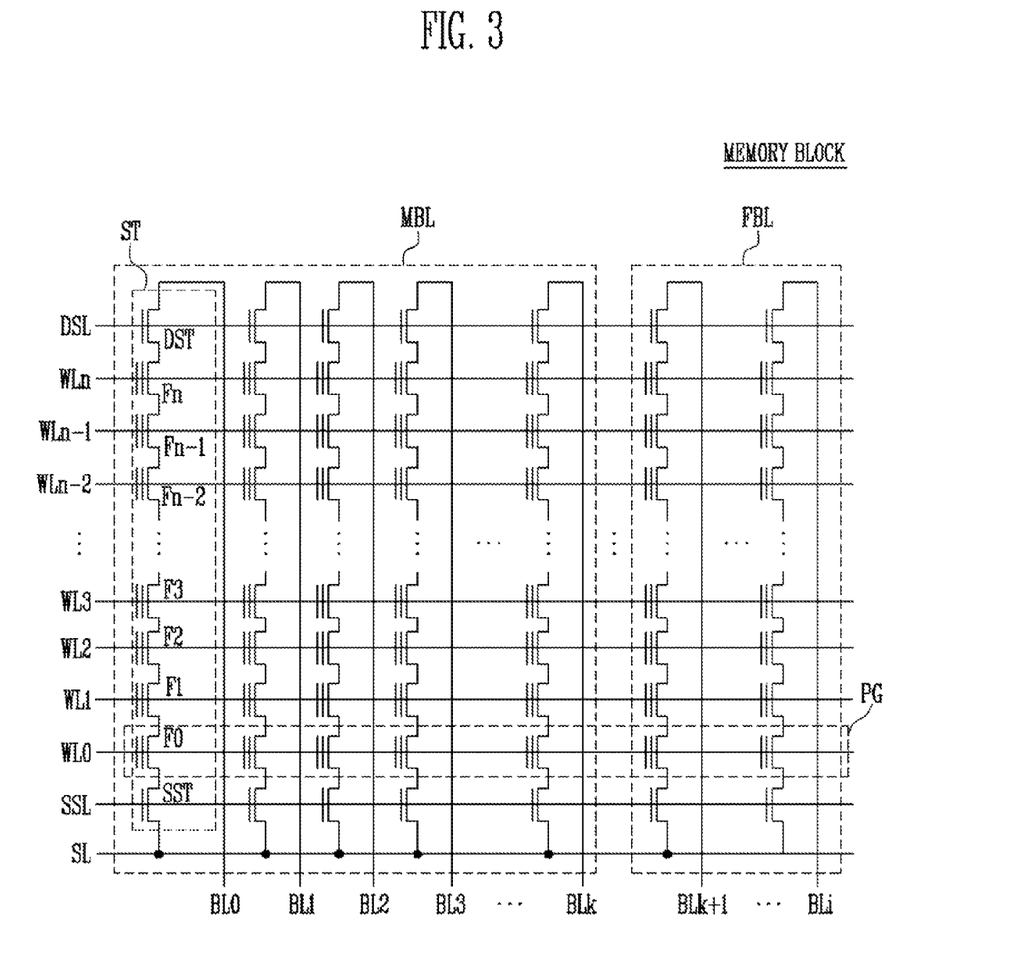
FIG. 3 is a circuit diagram illustrating a memory block of FIG. 2.

FIG. 3 is a circuit diagram illustrating a memory block of FIG. 2.

Referring to FIG. 3, a memory block may include a main subblock MBL in which main cells are included, and a flag subblock FBL in which flag cells are included. The main subblock MBL and the flag subblock FBL may include a plurality of strings ST connected between the bit lines BL0 to BLi and a source line SL. For example, the strings ST connected to the first to (k+1)-th bit lines BL0 to BLk may be included in the main subblock MBL, and the (k+2)-th to (i+1)-th bit lines BLk+1 to BLi may be included in the flag subblock FBL. The source line SL may be commonly connected to the memory blocks, and be connected to a ground terminal.

All of the strings ST may have the same structure. For example, the string ST connected to the first bit line BL0 may include a source select transistor SST, a plurality of memory cells F0 to Fn, and a drain select transistor DST which are connected in series between the source line SL and the first bit line BL0. Gates of the source select transistors SST included in different strings ST may be connected to a source select line SSL. Gates of the memory cells F0 to Fn may be connected to the first to (n+1)-th word lines WL0 to WLn. Gates of the drain select transistors DST may be connected to a drain select line DSL. A group of memory cells connected to the same word line may be referred to as a page PG. Accordingly, each page PG may include memory cells included in the main subblock MBL and flag cells included in the flag subblock FBL. Program data may be stored in the main cells, and information with respect to a page in which corresponding flag cells are included may be stored in the flag cells. For example, the information with respect to the page may include least significant bit (LSB) information and most significant bit (MSB) information of the page.

Figure 4:
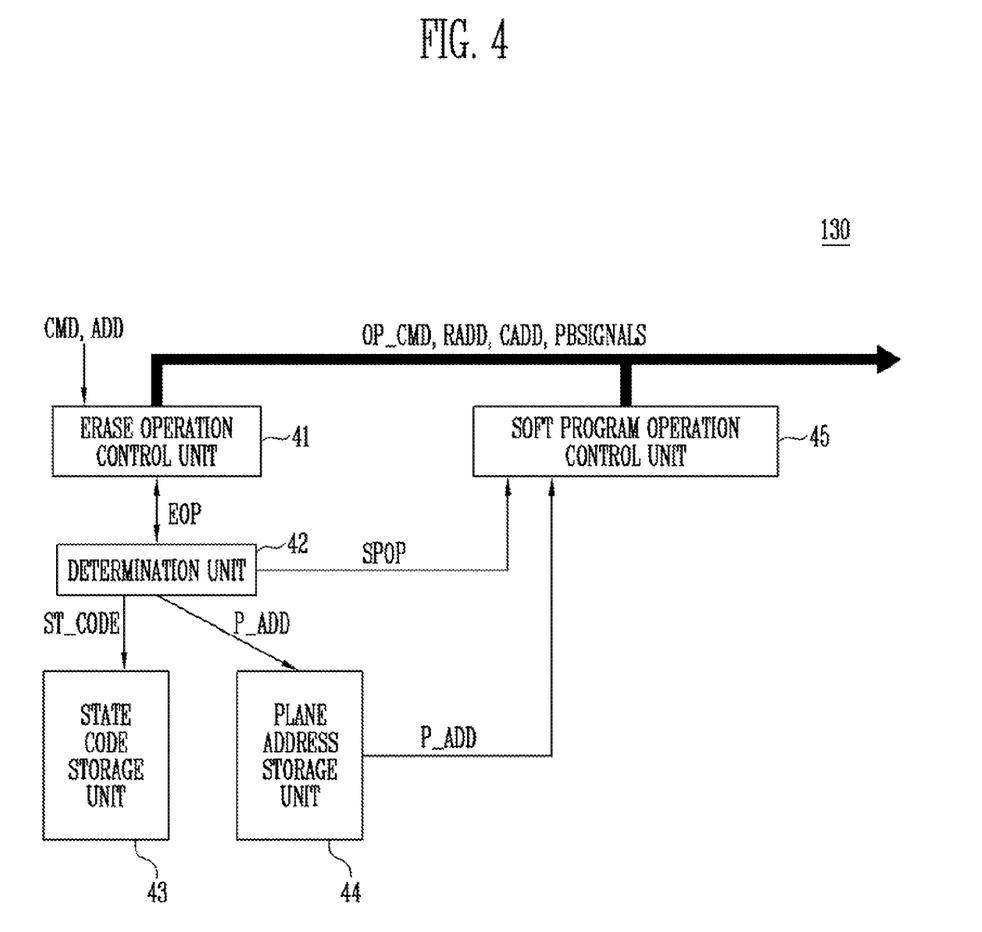
FIG. 4 is a diagram illustrating a control circuit of FIG. 1.

FIG. 4 is a diagram illustrating a control circuit of FIG. 1.

Referring to FIG. 4, for the multi-plane erase operation, the control circuit 130 may include an erase operation control unit 41, a determination unit 42, a state code storage unit 43, a plane address storage unit 44, and a soft program operation control unit 45.

In response to the command signal CMD, the address ADD or an erase operation signal regarding the multi-plane erase operation, the erase operation control unit 41 may output the operating command signal OP_CMD, the row address RADD, the column address CADD and the page buffer control signals PBSIGNALS for control of the peripheral circuit 120 to perform the erase operation on the selected memory blocks of the selected planes.

The determination unit 42 may determine whether the erase verifying operation or a soft program verifying operation passes or fails, and determine whether the number of erase loops or soft program loops reach the maximum number of times. When the erase verifying operation fails and the number of erase loops does not reach the maximum number, the determination unit 42 may output an erase operation processing signal EOP to the erase operation control unit 41. When the erase verifying operation passes or an address of the passed plane is stored in the plane address storage unit 44, the determination unit 42 may output a soft program operation processing signal SPOP to the soft program operation control unit 45.

The state code storage unit 43 may store a state code ST_CODE indicating that the multi-plane erase operation to the selected planes fails when the multi-plane erase operation on the selected planes fails and the number of erase loops reaches the maximum number.

The plane address storage unit 44 may store the address of the passed plane P_ADD when there is a passed plane to which the erase verifying operation passes among the selected planes although the multi-plane erase operation to the selected planes fails.

The soft program operation control unit 45 may output the operating command signal OP_CMD, the row address RADD, the column address CADD, and the page buffer control signals PBSIGNALS in response to the soft program operation processing signal SPOP and the address of the passed plane P_ADD, and may control the peripheral circuit 120 to start the soft program operation on a selected memory block of the passed plane or perform a next soft program loop on selected memory blocks of the selected planes, to which the multi-plane erase operation passes. At this time, the row address RADD may include the address of the passed plane PADD.

Figure 5:
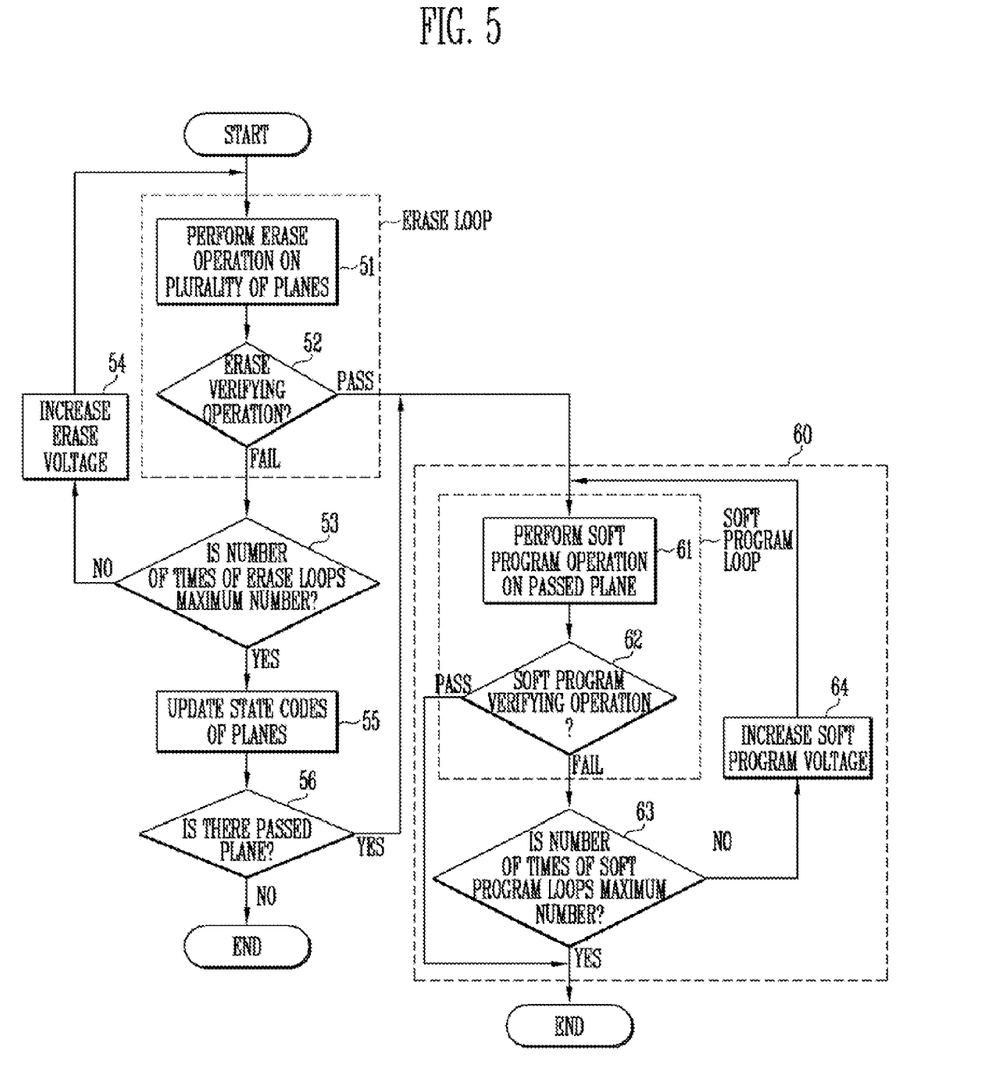
FIG. 5 is a flowchart illustrating a multi-plane erase operation of a semiconductor device according to an embodiment of the present invention.

FIG. 5 is a flowchart illustrating a multi-plane erase operation of the semiconductor device 1100 according to an embodiment of the present invention.

Referring to FIG. 5, when the multi-plane erase operation starts, the erase operation control unit 41 may perform the erase operation on the selected planes subject to the multi-plane erase operation at step 51. During the erase operation of step 51, the erase voltage may be applied to the selected memory blocks included in the selected planes.

After the erase voltage is applied to the selected memory blocks included in the selected planes, the determination unit 42 may perform the erase verifying operation on the selected planes at step 52. During the erase verifying operation, it may be determined whether threshold voltages of the memory cells included in the selected memory blocks are lower than an erase verifying voltage. When it is determined that the threshold voltages of at least one or more memory cells are higher than the erase verifying voltage, the determination unit 42 may determine the erase verifying a failure. When it is determined that all of the threshold voltages of the memory cells are lower than the erase verifying voltage, the determination unit 42 may determine the erase verifying operation to have passed.

Steps 51 and 52 may configure a single erase loop. For example, whenever the erase operation control unit 41 and the determination unit 42 may perform steps 51 and 52, the number erase loops may increase. The erase loop may be performed through the incremental step pulse erase (ISPE) method.

When the erase verifying operation is determined to have failed at step 52, the determination unit 42 may determine whether the number of erase loops reaches the maximum number of times of the erase loops at step 53. The maximum number of erase loops may be preset in the semiconductor device to prevent infinite performing of the erase loop.

When the number erase loops is smaller than the maximum number of times of the erase loops as a result of step 53, the erase voltage may be increased by a step voltage at step 54 and the erase operation control unit 41 and the determination unit 42 may repeat the erase loop.

When the number erase loops is equal to the maximum number of erase loops as the result of step 53, the state code ST_CODE of the selected planes may be updated at step 55. That is, the state code ST_CODE indicating that the selected planes are determined to have failed the multi-plane erase operation may be stored in the state code storage unit 43.

After the state code ST_CODE is stored at step 55, the determination unit 42 may determine whether there are one or more passed planes, to which the erase verifying operation passes, among the selected planes, to which the multi-plane erase operation fails, at step 56. When there is not a passed plane among the selected planes as a result of step 56, access to the memory blocks of the selected planes may be blocked, and the multi-plane erase operation may end.

However, when there are one or more passed plane among the selected plane as the result of step 56, the determination unit 42 may store the address of the passed plane P_ADD into the plane address storage unit 44 and a multi-plane soft program operation of step 60 on the passed planes may be performed by the soft program operation control unit 45 in response to the address of the passed plane P_ADD from the plane address storage unit 44 at step 60. Access to the memory block of remaining planes, to which the erase verifying operation fails, may be blocked.

The soft program operation control unit 45 may also perform the multi-plane soft program operation of step 60 in response to the soft program operation processing signal SPOP from the determination unit 42 when the multi-plane erase operation on all of the selected planes passes as the result of step 52.

The soft program operation control unit 45 may perform the multi-plane soft program operation of step 60 to narrow a width of threshold voltage distributions of the erased memory cells included in the passed planes, which are described with reference to step 56, and the selected planes, to which the multi-plane erase operation passes as described with reference to step 52.

During the multi-plane soft program operation of step 60, the soft program operation control unit 45 may perform the soft program operation to the erased memory cells included in the passed planes and the selected planes at step 61. During the soft program operation of step 61, a program allowance voltage (for example, 0 V) may be applied to the bit lines connected to the selected memory block, and the soft program voltage may be applied to the word lines connected to the selected memory block in the passed planes and the selected planes.

After the soft program voltage is applied, the determination unit 42 may perform the soft program verifying operation on the select memory block at step 62. During the soft program verifying operation, it may be determined whether the threshold voltages of the memory cells included in the selected memory blocks are lower than a soft program verifying voltage. When it is determined that the threshold voltages of at least one or more memory cells are lower than the soft program verifying voltage, the determination unit 42 may determine the soft program verifying operation to have failed. When it is determined that the threshold voltages of all of the memory cells are higher than the soft program verifying voltage, the determination unit 42 may determine the soft program verifying operation to have passed.

Steps 61 and 62 may configure a single soft program loop. For example, whenever the soft program operation control unit 45 and the determination unit 42 may perform steps 61 and 62, the number of soft program loops may increase. The soft program loop may be performed through the incremental step pulse program (ISPP) method.

When the soft program verifying operation is determined to pass at step 62, the soft program operation may end.

When the soft program verifying operation is determined to have failed at step 62, the determination unit 42 may determine whether the number soft program loops reaches the maximum number at step 63. The maximum number of soft program loops may be preset in the semiconductor device to prevent infinite performing of soft program loops.

When the number of soft program loops is less than the maximum number of soft program loops, as a result of step 63, the soft program voltage may be increased by a step voltage at step 64, and the soft program operation control unit 45 and the determination unit 42 may repeat the soft program loop.

When the number of soft program loops is equal to the maximum number of soft program loops as the result of step 63, the soft program operation may end.

As described above, even though the multi-plane erase operation fails due to failure of the erase verifying operation on part of the selected plane, when there are one or more passed planes among the selected planes, a waste of planes may be prevented by using the passed planes as normal planes.

Figure 6:
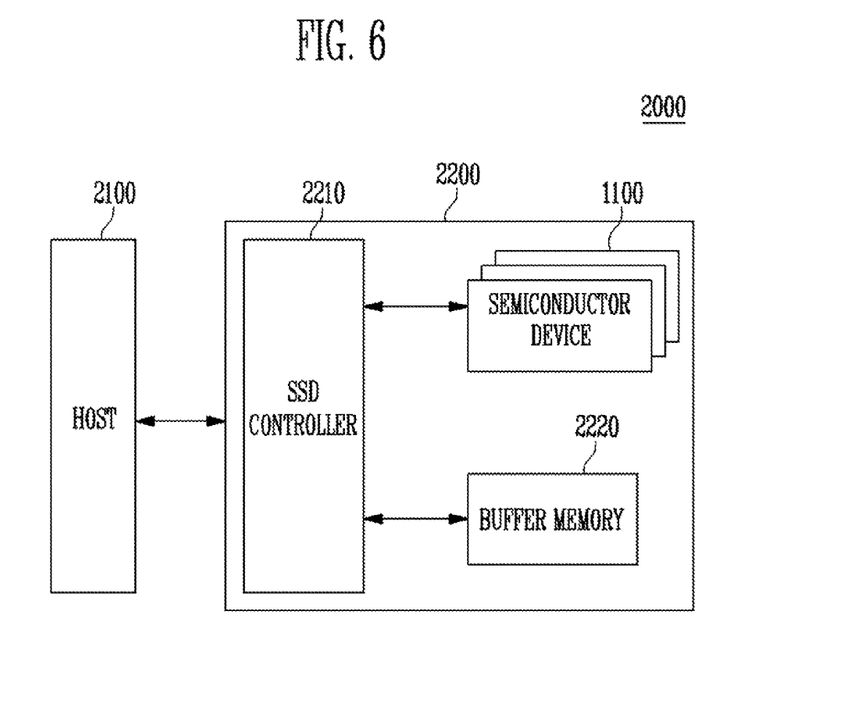
FIG. 6 is a block diagram illustrating a solid state drive including a semiconductor device according to an embodiment of the present invention.

FIG. 6 is a block diagram illustrating a solid state drive including a semiconductor device according to an embodiment of the present invention.

Referring to FIG. 6, a drive device 2000 may include a host 2100 and a solid state drive (SSD) 2200. The SSD 2200 may include a SSD controller 2210, a buffer memory 2220, and a semiconductor device 1100.

The SSD controller 2210 may provide a physical connection between the host 2100 and the SSD 2200. That is, the SSD controller 2210 may provide an interface with the SSD 2200 corresponding to a bus format of the host 2100. Particularly, the SSD controller 2210 may decode a command provided from the host 2100. The SSD controller 2210 may access the semiconductor device 1100 according to the decoded result. The bus format of the host 2100 may include a Universal Serial Bus (USB) protocol, a Small Computer System Interface (SCSI) protocol, a Peripheral Component Interconnect (PCI)-Express (PCI-E) protocol, an Advanced Technology Attachment (ATA) protocol, a Parallel ATA (PATA) protocol, a Serial ATA (SATA) protocol, a Serial Attached SCSI (SAS) protocol, etc.

Program data provided from the host 2100 or data read from the semiconductor device 1100 may be temporarily stored in the buffer memory 2220. When data present in the semiconductor device 1100 is cached in a read request of the host 2100, the buffer memory 2220 may support a cache function of directly providing the cached data to the host 2100. Generally, a data transmission speed by the bus format (for example, SATA or SAS) of the host 2100 may be greater than that of a memory channel of the SSD 2200. That is, when an interface speed of the host 2100 is greater than the data transmission speed of the memory channel of the SSD 2200, performance degradation generated due to a speed differences may be minimized by providing a buffer memory 2220 having a large capacity. The buffer memory 2220 may be provided as a synchronous DRAM (SDRAM) to provide sufficient buffering in the SSD 2200 used as an auxiliary storage device having a large capacity.

The semiconductor device 1100 may be provided as a storage medium of the SSD 2200. For example, the semiconductor device 1100 may be provided as a non-volatile memory device having a large capacity as described above with reference to FIG. 1, and may be provided as a NAND-type flash memory among the non-volatile memories.

Figure 7:
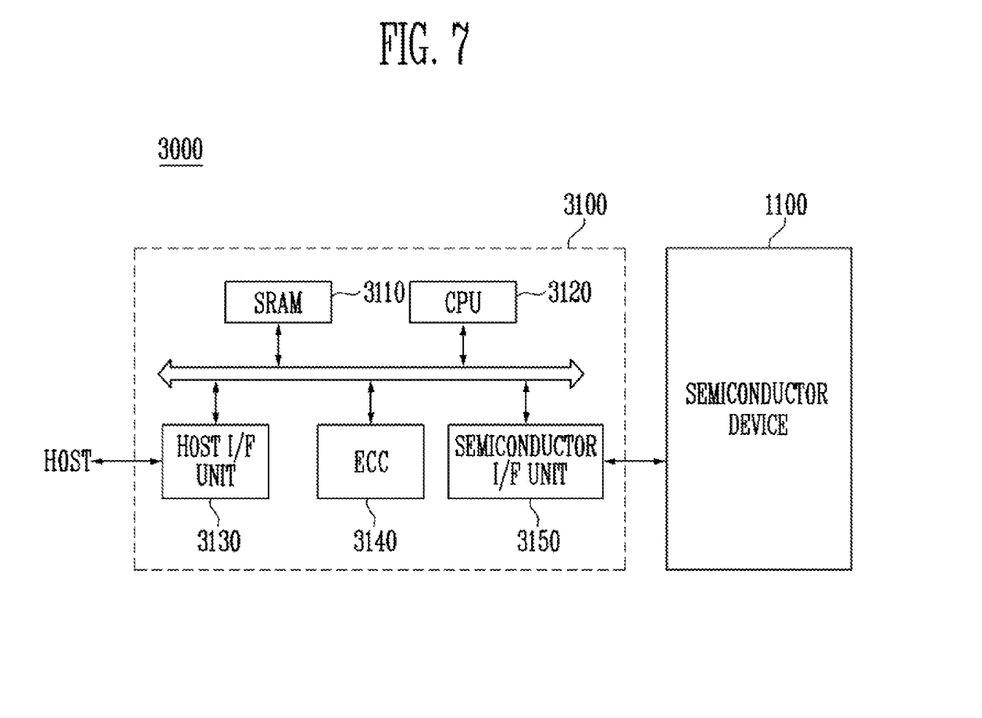
FIG. 7 is a block diagram illustrating a memory system including a semiconductor device according to an embodiment of the present invention.

FIG. 7 is a block diagram illustrating a memory system including a semiconductor device according to an embodiment of the present invention.

Referring to FIG. 7, a memory system 3000 according to an embodiment of the present invention may include a memory controller 3100 and a semiconductor device 1100.

Since the semiconductor device 1100 may substantially have the same configuration as the semiconductor device of FIG. 1, a detailed description thereof will be omitted.

The memory controller 3100 may be configured to control the semiconductor device 1100. An SRAM 3110 may be used as an operating memory of a central processing unit (CPU) 3120. A host interface (I/F) unit 3130 may have a data exchange protocol of a host connected to the memory system 3000. An error correction circuit (ECC) 3140 included in the memory controller 3100 may detect and correct an error included in data read from the semiconductor device 1100. A semiconductor interface (I/F) unit 3150 interface with the semiconductor device 1100. The CPU 3120 may perform a control operation for data exchange of the memory controller 3100. Further, although not shown in FIG. 7, the memory system 3000 may further include a read only memory (ROM) (not shown) for storing code data for an interface with the host.

The memory system 3000 according to an embodiment of the present invention may be provided as one among a computer, an ultra mobile personal computer (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device for wirelessly transmitting and receiving information, and various electronic devices configuring a home network.

Figure 8:
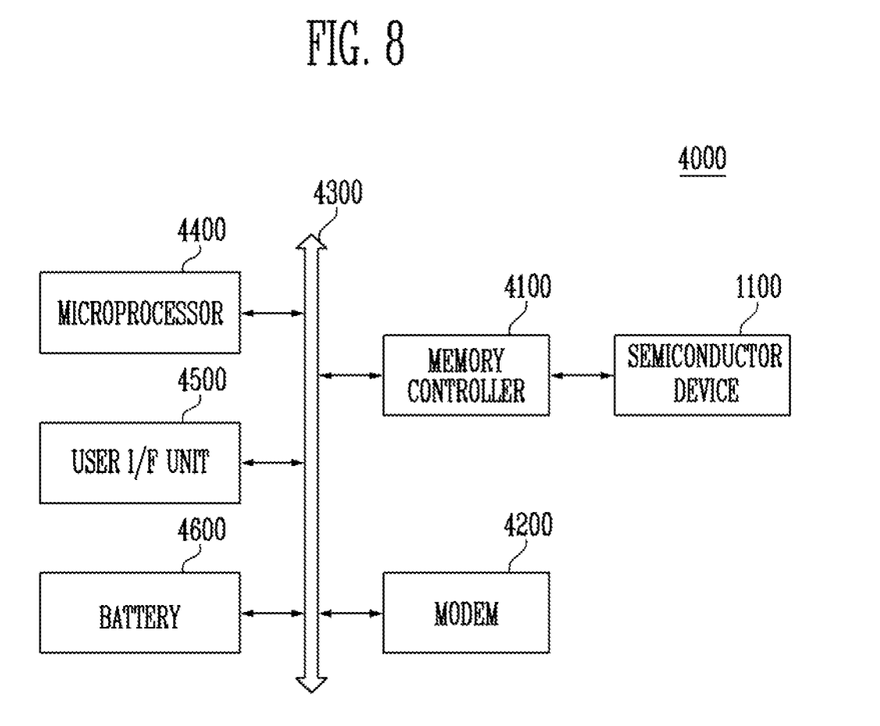
FIG. 8 is a schematic diagram illustrating a computing system including a semiconductor device according to an embodiment of the present invention.

FIG. 8 is a schematic diagram illustrating a computing system including a semiconductor device according to an embodiment of the present invention.

Referring to FIG. 8, a computing system 4000 according to an embodiment of the present invention may include a semiconductor device 1100, a memory controller 4100, a modem 4200, a microprocessor 4400, and a user interface (I/F) unit 4500, which are electrically connected to a bus 4300. When the computing system 4000 is a mobile device, a battery 4600 for supplying an operating voltage of the computing system 4000 may be further included. Although not shown, the computing system 4000 according to an embodiment of the present invention may further include an application chipset, a camera image processor (CIS), and a mobile DRAM, etc.

Since the semiconductor device 1100 may substantially have the same configuration as the semiconductor device of FIG. 1, a detailed description thereof will be omitted.

The memory controller 4100 and the semiconductor device 1100 may configure the SSD.

The semiconductor device 1100 and the memory controller 4100 may be mounted in various types of packages. For example, the semiconductor device 1100 and the memory controller 4100 may be packaged and mounted in a manner such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), or the like.

In accordance with an embodiment of the present invention, even though the multi-plane erase operation to the selected planes fails due to a failure of the erase verifying operation to a part of the selected plane, when there are one or more passed planes to which the erase verifying operation passes among the selected planes, waste of the planes may be prevented by using the passed plane as a normal plane.

The technical spirit of the present invention has been described with reference to exemplary embodiments in detail, but it should be noted that the embodiments are not intended to limit the scope of the present invention. Therefore, it will be understood by those of ordinary skill in the art that various changes in form and detail may be made without departing from the spirit and scope of the present invention as defined by the following claims.

What is claimed is:

1. A method of operating a semiconductor device, comprising:

performing a multi-plane erase operation on selected planes, the multi-plane erase operation including a plurality of erase loops, each of the selected planes including a plurality of memory blocks including a selected memory block, and each of the plurality of erase loops including an erase operation and an erase verifying operation;

determining that the multi-plane erase operation fails;

determining whether there is at least one passed plane among the selected planes in response to the determining that the multi-plane erase operation fails;

storing information corresponding to an address of the at least one passed plane; and performing a soft program operation on the at least one passed plane in response to the information, wherein the failure of the multi-plane erase operation indicates that it is determined that at least one of the selected planes fails based on the erase verifying operation when the number of the erase loops reaches a maximum number.

2. The method of operating the semiconductor device of claim 1, further comprising performing the soft program operation on all of the selected planes when the multi-plane erase operation on the selected plane passes.

3. The method of operating the semiconductor device of claim 1, wherein the plurality of erase loops are performed through an incremental step pulse erase (ISPE) method.

4. The method of operating the semiconductor device of claim 1, further comprising:

updating a state code to indicate the failure of the multi-plane erase operation on the selected planes.

5. The method of operating the semiconductor device of claim 1, wherein the soft program operation is performed through an incremental step pulse program (ISPP) method.

6. The method of operating the semiconductor device of claim 1, wherein the soft program operation comprises:

performing a soft programming operation on the at least one passed plane; and performing a soft program verifying operation on the at least one passed plane.

7. The method of operating the semiconductor device of claim 1, further comprising blocking an access to a memory block included in at least one plane other than the at least one passed plane among the selected planes.

8. A semiconductor device, comprising:

a plurality of planes suitable for storing data and including a first plane and a second plane, each of the plurality of planes including a plurality of memory blocks, the first plane including a first memory block, among the plurality of memory blocks, corresponding to a row address, the second plane including a second memory block, among the plurality of memory blocks, corresponding to the row address;

a peripheral circuit suitable for performing a multi-plane erase operation on the first and second planes, and for performing a soft program operation on a passed plane among the first and second planes, the multi-plane erase operation including a plurality of erase loops, each of the plurality of erase loops including an erase operation and an erase verifying operation; and a control circuit suitable for determining whether there is the passed plane among the first and second planes, when the multi-plane erase operation on the first and second planes fails, for storing information indicating an address of the passed plane in response to the determining, and for controlling the peripheral circuit to perform the soft program operation on the passed plane in response to the information, wherein the failure of the multi-plane erase operation on the first and second planes indicates that it is determined that at least one of the first memory block and the second memory block fails based on the erase verifying operation when the number of the erase loops of the multi-plane erase operation reaches a maximum number.

9. The semiconductor device of claim 8, wherein the peripheral circuit includes:

a voltage generation circuit suitable for generating operating voltages having various levels in response to an operating command signal;

a row decoder suitable for transferring the operating voltages to the first memory block and the second memory block in response to the row address;

a page buffer suitable for exchanging data with the first and second planes in response to page buffer control signals, and temporarily storing the data;

a column decoder suitable for exchanging data with the page buffer in response to a column address; and an input and output circuit suitable for transferring a command signal and an address transferred from outside to the control circuit, and input and output data.

10. The semiconductor device of claim 8, wherein the control circuit comprises:

an erase operation control unit suitable for controlling the peripheral circuit to perform the multi-plane erase operation;

a soft program operation control unit suitable for controlling the peripheral circuit to perform the soft program operation;

a determination unit suitable for determining whether the multi-plane erase operation and the soft program operation pass or fail, and identifying the number of the erase loop of the multi-plane erase operation and the number of soft program loops of the soft program operation;

a state code storage unit suitable for storing a state code of the multi-plane erase operation to the selected planes; and a plane address storage unit suitable for storing the addresses of the passed plane.

11. The semiconductor device of claim 10, wherein the erase operation control unit controls the peripheral circuit to perform the erase operation on the first and second planes in response to a command signal, an address, or an erase operation signal regarding the multi-plane erase operation.

12. The semiconductor device of claim 10, wherein the soft program operation control unit controls the peripheral circuit to perform the soft program operation on the passed plane in response to a soft program operation processing signal.

13. The semiconductor device of claim 11, wherein the determination unit outputs the erase operation processing signal and the soft program operation processing signal according to results of the determination and the number of the erase loop of the multi-plane erase operation.

14. The semiconductor device of claim 13, wherein the determination unit outputs the erase operation processing signal to the erase operation control unit when the erase verifying operation on the first or second planes fails and the number of the erase loop of the multi-plane erase operation does not reach the maximum number, and wherein the determination unit outputs the soft program operation processing signal to the soft program operation control unit when the address of the passed plane is stored in the plane address storage unit.

15. The semiconductor device of claim 10, wherein the state code storage unit stores the state code when the multi-plane erase operation fails and the number of the erase loops reaches the maximum number.

16. The semiconductor device of claim 10, wherein the plane address storage unit stores the address of the passed plane when there is a plane on which the erase verifying operation passes even when the multi-plane erase operation fails.

* * * * *